United States Patent [19]

Childs

[11] Patent Number: 5,119,392

[45] Date of Patent: Jun. 2, 1992

[54] SECOND-ORDER PREDISTORTION CIRCUIT FOR USE WITH LASER DIODE

[75] Inventor: Richard B. Childs, Harvard, Mass.

[73] Assignee: GTE Laboratories Incorporated, Waltham, Mass.

[21] Appl. No.: 616,503

[22] Filed: Nov. 21, 1990

[51] Int. Cl.$^5$ .............................................. H01S 3/133
[52] U.S. Cl. ...................................... 372/38; 372/31; 330/149; 330/277
[58] Field of Search ............................ 372/31, 38, 29; 330/149, 277; 455/609

[56] References Cited

U.S. PATENT DOCUMENTS

| | | | |
|---|---|---|---|
| 4,465,980 | 8/1984 | Huang et al. | 330/149 |
| 4,564,816 | 1/1986 | Kumar et al. | 330/277 |
| 4,992,754 | 2/1991 | Blauvelt et al. | 330/149 |
| 5,012,475 | 4/1991 | Campbell | 372/31 |

OTHER PUBLICATIONS

Darcie et al., IEEE Transactions on Microwave Theory and Techniques, vol. 38, No. 5, May 1990, pp. 524–533.

Childs et al., Optical Fiber Communication Conference, 1990 Technical Digest Series, vol. 1, Conference Edition, Jan. 22–26, 1990.

Primary Examiner—William L. Sikes
Assistant Examiner—Susan S. Morse
Attorney, Agent, or Firm—Victor F. Lohmann, III; Lawrence E. Monks

[57] ABSTRACT

A second-order predistortion circuit for linearizing a nonlinear device having a transfer function of the form $F = C_1 I_1 - C_2 (I_1)^2$, where $I_1$ is a current applied to an input of the nonlinear device, and $C_1$ and $C_2$ are constants. The nonlinear device is typically a laser diode. The predistortion circuit includes a field effect transistor biased for square law operation. An input voltage is applied between the gate and source electrodes of the field effect transistor. An amplifier is connected between the drain electrode of the field effect transistor and the input of the nonlinear device. The gain of the amplifier is selected to minimize second-order distortion in the output of the nonlinear device as a function of the input voltage to the field effect transistor.

5 Claims, 3 Drawing Sheets

SECOND-ORDER PREDISTORTION CIRCUIT FOR USE WITH LASER DIODE

FIELD OF THE INVENTION

This invention relates to circuits for linearizing nonlinear devices and, more particularly, to circuits for reducing second order distortion in nonlinear devices to thereby increase the dynamic range of such devices. The second order predistortion circuit of the invention is particularly useful for linearizing laser diodes, but is not limited to such use.

BACKGROUND OF THE INVENTION

The dynamic range of a communication system is often limited by the nonlinear characteristics of devices that are used in the system. Harmonics, or distortion products, generated by the nonlinear devices interfere with transmission of the desired signal. Usually, second-order distortion products are most troublesome because they are most likely to fall within the bandwidth of the communication system or may fall within adjacent bands in a multichannel system. An example of such a nonlinear device is a directly modulated laser diode that is frequently used in optical communication systems. The laser diode generates a light beam which is modulated by applying an information carrying signal to the laser diode. The modulation signal may include one or a number of channels.

Predistortion linearization is a known technique wherein a predistortion circuit containing an additional nonlinear device compensates for the characteristics of the nonlinear communication device. The predistortion circuit generates distortion products which are approximately equal in amplitude but opposite in phase to the distortion products generated by the nonlinear communication device. In the overall transfer characteristic between the input of the predistortion circuit and the output of the nonlinear device, second order distortion products are reduced or eliminated.

It is desirable to provide communication systems having a large dynamic range. This is particularly difficult in wideband optical communication systems which may have a bandwidth of up to several gigahertz and transmit multiple channels simultaneously.

It is a general object of the present invention to provide a second order predistortion linearization circuit for linearizing a nonlinear device.

It is another object of the present invention to provide communication systems having large dynamic ranges.

It is a further object of the present invention to provide a circuit for linearizing the characteristics of a laser diode.

It is a further object of the present invention to provide improved optical communication systems.

It is yet another object of the present invention to provide second order predistortion linearization circuits which are simple in construction and low in cost.

SUMMARY OF THE INVENTION

According to the present invention, these and other objects and advantages are achieved in a circuit for linearizing a nonlinear device having a transfer function F of the form $F = C_1 I_1 - C_2(I_1)^2$, where $I_1$ is a current applied to an input of the nonlinear device, and $C_1$ and $C_2$ are constants. The circuit comprises a field effect transistor having gate, drain and source electrodes, means for biasing the field effect transistor for approximately square law operation, means for applying an input voltage between the gate and source electrodes of the field effect transistor, the input voltage causing a drain current to flow in the drain electrode, and means coupled between the drain electrode of the field effect transistor and the input of the nonlinear device for providing an input signal to the nonlinear device, the input signal to the nonlinear device being proportional to the drain current of the field effect transistor.

Typically, the nonlinear device is a laser diode. The means for providing an input signal to the nonlinear device is typically an amplifier having a gain that is selected to minimize second order distortion in the output of the nonlinear device as a function of the input voltage. A resistor can optionally be connected in series with the source electrode of the field effect transistor for scaling of the second order coefficient of the circuit. The drain current of the field effect transistor is preferably related to the gate to source voltage by a square law relationship. However, the exponent of the relationship between the gate to source voltage and the drain current can be in the range of about 1.2 to 2.7.

BRIEF DESCRIPTION OF THE DRAWINGS

For a better understanding of the present invention, together with other and further objects, advantages and capabilities thereof, reference is made to the accompanying drawings which are incorporated herein by reference and in which.

DETAILED DESCRIPTION OF THE INVENTION

Figure 1:
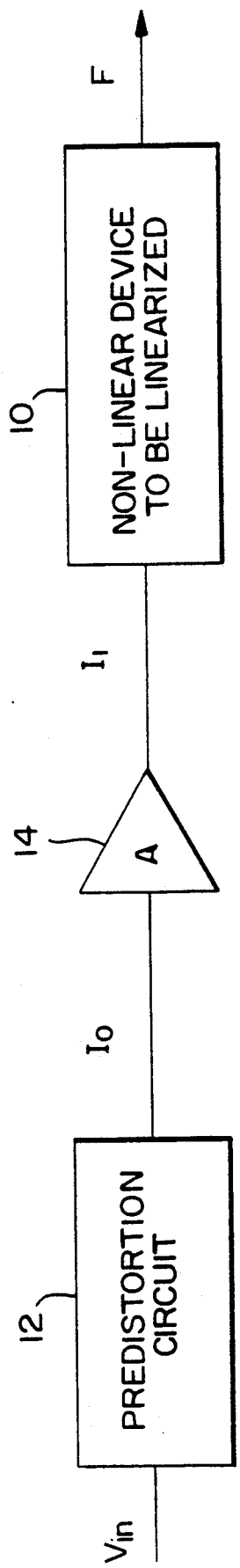
FIG. 1 is a block diagram of the predistortion linearization technique of the present invention.

A block diagram of the predistortion linearization technique is shown in FIG. 1. A device 10 has a nonlinear transfer characteristic, such that an output is a nonlinear function of an input current $I_1$. The transfer function of the device 10 is of the form:

$$F = C_1 I_1 - C_2(I_1)^2 \qquad (1)$$

where F = the nonlinear device transfer function, $I_1$ = the current applied to the nonlinear device and $C_1$ and $C_2$ are constants. In equation (1), terms higher than second order have been omitted. In FIG. 1, a predistortion circuit 12 receives an input voltage $V_{in}$ and provides an output current $I_0$. The output current $I_0$ is amplified by an amplifier 14 to provide the input current $I_1$ to the nonlinear device 10. The transfer function of the predistortion circuit is of the form:

$$I_o = K_1 V_{in} + K_2(V_{in})^2 \qquad (2)$$

where $I_0$ = the output current of circuit 12, $V_{in}$ = the input voltage to circuit 12 and $K_1$ and $K_2$ are constants. Preferably, the predistortion circuit 12 should generate little or no third order distortion which could also restrict the dynamic range of the communication system.

The amplifier 14 has a current gain A such that:

$$I_1 = A I_o = A(K_1 V_{in} + K_2 V_{in}^2) \qquad (3)$$

By substitution of equation (3) into equation (1), the cascaded transfer function of the predistortion circuit 12, the amplifier 14 and the nonlinear device 10 becomes:

$$F = C_1 A K_1 V_{in} + (C_1 A K_2 - C_2 A^2 K_1^2)$$

$$-2C_2 A^2 K_1 K_2 V_{in}^3 + \text{higher order terms} \quad (4)$$

When the gain of amplifier 14 is selected such that:

$$A = \frac{C_1 K_2}{C_2 K_1^2}, \quad (5)$$

the second-order distortion produced by the nonlinear device 10 is cancelled at the expense of an increase in higher order distortion. In the general case, an amplifier gain of unity or less may be required. In this case, the amplifier 14 can be replaced with a direct connection between predistortion circuit 12 and nonlinear device 10 or by an attenuator.

The predistortion circuit 12 is a nonlinear circuit which generates second order terms of the form shown in equation (2). These second order terms compensate for second order distortion products produced by the nonlinear device 10 and represented by equation (1). The predistortion circuit 12 is particularly useful for linearizing a directly modulated diode which would otherwise generate considerable second order distortion. Use of the predistortion circuit greatly increases the dynamic range of an optical communication system using a directly modulated laser diode.

Figure 2:
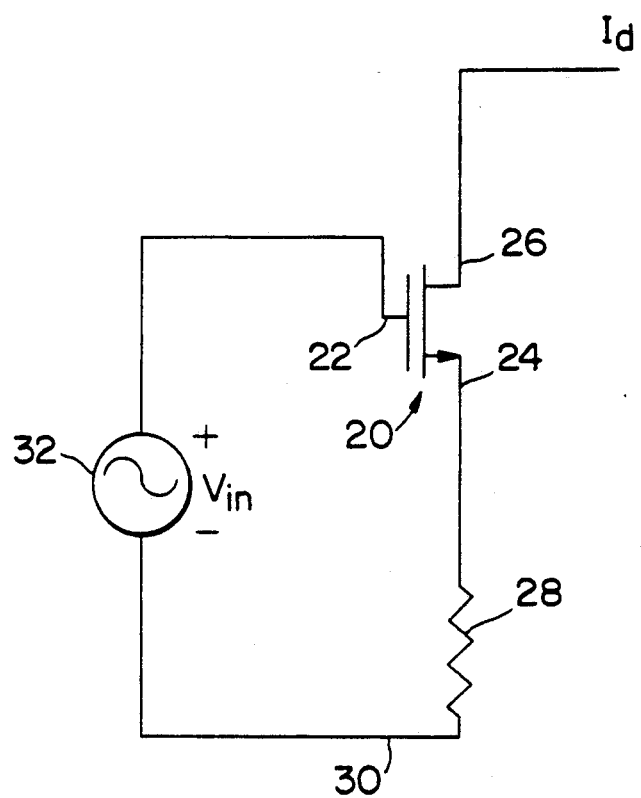
FIG. 2 is a simplified schematic diagram of the predistortion circuit of the invention.

A simplified schematic diagram of the second order predistortion circuit of the invention is shown in FIG. 2. The circuit utilizes the square law or approximately square law transfer characteristic of a field effect transistor (FET) to generate second-order distortion products. An FET 20 includes a gate electrode 22, a source electrode 24 and a drain electrode 26. An optional resistor 28 may be connected in series with the source electrode 24 for scaling of the second order coefficient $K_2$ (see equation (2)). An input signal voltage $V_{in}$ is applied between gate electrode 22 and a node 30 connected to one end of resistor 28. The input signal voltage $V_{in}$ is represented by a signal source 32. When resistor 28 is omitted, the input voltage $V_{in}$ is connected directly between gate electrode 22 and source electrode 24.

Either the gate electrode 22 or node 30 can be connected to ground, thereby providing a common source configuration or a common gate configuration, respectively. In the common gate configuration, the output impedance of signal source 32 is included with resistor 28. In the common source configuration, the output impedance of signal source 32 is usually negligible due to the high input impedance of FET 20.

The drain current $I_d$ of the FET 20 includes second order distortion products which compensate for the distortion products generated by nonlinear device 10. Additional resistors may be included in the circuit of FIG. 2 for impedance matching without altering basic operation of the circuit. Although DC biasing components are not shown in FIG. 2, it is assumed that the FET 20 is biased in the square law region, with sufficient drain bias voltage to operate with saturated drain current.

The drain electrode 26 can be connected to a load resistor, an amplifier input or other passive or active network with a constant current gain or loss. The drain electrode 26 can be connected to active devices such as a common base or a common gate transistor with a current gain of approximately unity, thereby providing a well known cascode structure. A common gate FET can be integrated with the FET 20, thereby providing a dual gate FET which is equivalent to an integrated cascode of two FET's. The output current of the predistortion circuit is given by:

$$I_o = C I_d. \quad (6)$$

where C is a constant determined by the output current coupling network.

The FET 20 can be any FET structure having a current voltage characteristic approximated by a square law relationship. The FET 20 can, for example, be a JFET, MOSFET, MESFET, MODFET or HEMT. For the case of a small signal voltage at the drain of the FET 20, the current voltage characteristic can be approximated as:

$$I_d = \beta (V_{gs} - V_T)^N \quad (7)$$

where $\beta$ = a constant, $I_d$ = the drain current, $V_{gs}$ = the FET gate-source voltage, $V_T$ = the FET threshold voltage, and N = a constant (2 for ideal square law). The exponent N is ideally equal to 2 for a constant carrier mobility, but can vary from about 1.0 to 2.7 due to field and doping dependent variations in carrier mobility. High field effects in short channel MESFET's generally provide values of N between 1 and 1.5. For the second order predistortion circuit of the invention, an exponent N of approximately 2 is desired to minimize third order distortion. An exponent N of about 2 can be achieved in a long channel FET. However, adequate performance for many applications can be obtained with an exponent N in the range of about 1.2 to 1.7, if the resulting third order distortion can be tolerated.

All physically realizable FET's have some parasitic source resistance due to ohmic contacts and areas of the channel which are not under the gate electrode. Source resistor 28 is beneficial for scaling of the second order coefficient $K_2$, if the resulting third-order distortion can be tolerated. For a given second order coefficient, inclusion of the source resistor 28 increases the output current amplitude, thereby improving the resulting signal to noise ratio.

Figure 3:
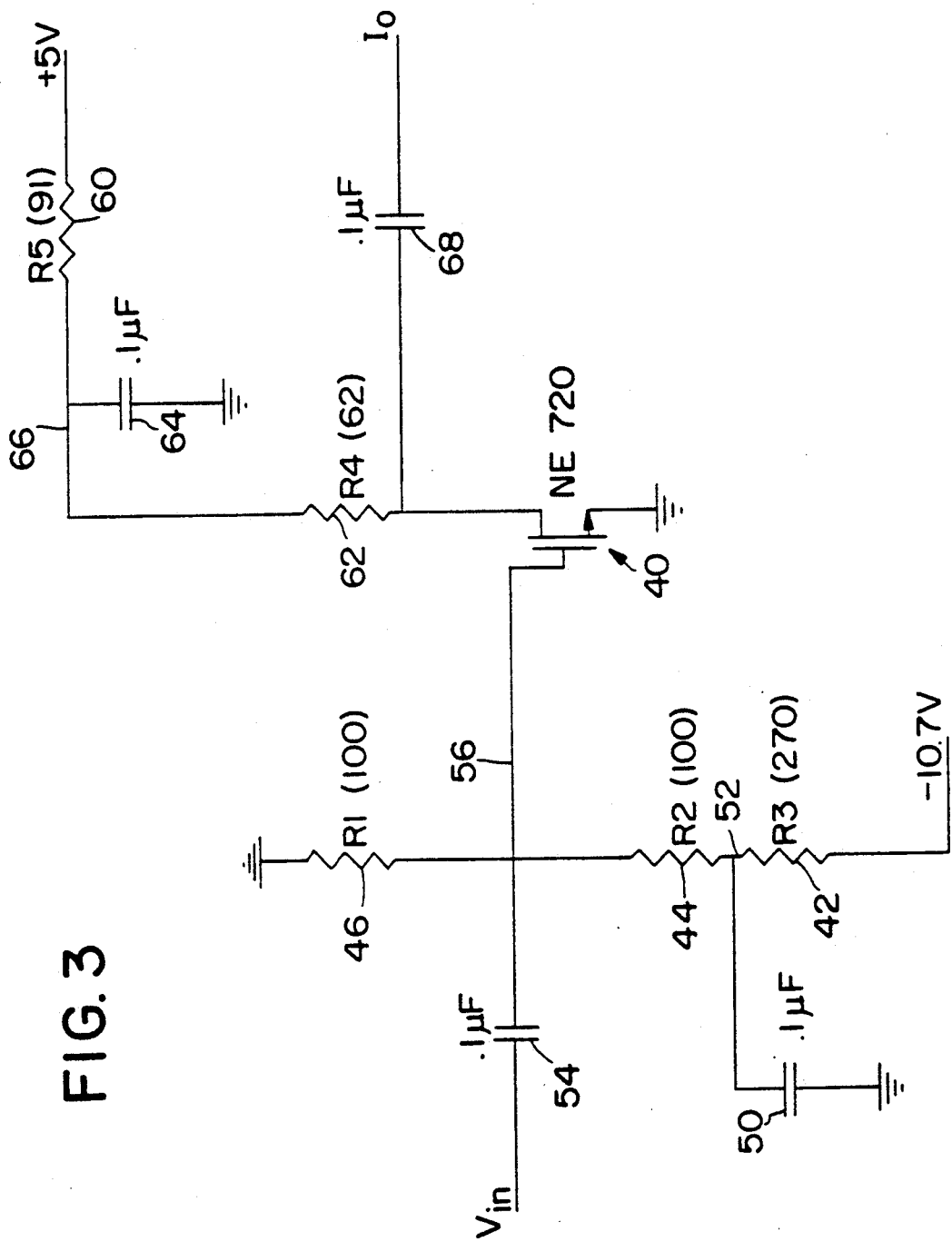
FIG. 3 is a schematic diagram of an example of a predistortion circuit in accordance with the present invention.

A schematic diagram of a second-order predistortion circuit in accordance with the invention is shown in FIG. 3. An FET 40 is used in a common source configuration with no external source resistor. A gallium arsenide MESFET, type NE720, was used. Although this device has an exponent N of about 1.5, acceptable levels of third order distortion ar provided for some applications. The circuit of FIG. 3 is designed to operate in a frequency range of about 50 MHz to 550 MHz. Resistors 42, 44 and 46 are connected in series between a negative voltage supply of −10.7 volts and ground. The resistors 42, 44 and 46 provide a 50 ohm input impedance at input frequencies of interest and bias the gate electrode of FET 40 at about −2.28 volts. A capacitor 50 is connected between node 52 and ground. The input signal $V_{in}$ is coupled through a capacitor 54 to node 56 and to the gate electrode of FET 40. Resistors 60 and 62 are coupled between a positive 5 volt power supply and the drain electrode of FET 40. A capacitor 64 is connected between node 66 and ground. Resistors 60 and 62 provide a 50 ohm output impedance at frequencies of interest and bias the drain electrode of FET 40 at about +3 volts. The output is coupled through a capacitor 68 into a 50 ohm input impedance amplifier (not shown). The capacitor 68 has an impedance of much less than 50 ohms at all frequencies of interest. The small signal drain current $I_d$ of FET 40 is approximately equally divided between resistors 60, 62 and the amplifier input, which results in a value of 0.5 for C in equation (6). The output of the predistortion circuit shown in FIG. 3 was connected to an amplifier as shown in FIG. 1 with approximately 31 dB gain. The output of the amplifier was applied to a laser diode 10 (Mitsubishi type FU-45SDFDF-3) through an impedance matching network. The second order and third order distortion of the laser diode was measured over the CATV video band of approximately 50 to 425 MHz using composite distortion measuring techniques with and without the predistortion circuit shown in FIG. 3. Composite second order (CSO) and composite triple beat (CTB) are measurements of the worst case sum of the second and third order distortion products produced over the entire video band. Therefore, a CTB and CSO provide a useful measure of distortion in systems with frequency dependent distortion products. Typical AM video transmission system requirements for CSO and CTB are −60 dBc.

A 50 channel AM video signal was applied to the circuit input. Measurements of CSO AND CTB were made using notched filters to permit measurements of CTB near the center channel (223.25 MHz) and CSO at the band edges (48 and 458.5 MHz). Using the predistortion linearization circuit of FIG. 3, a reduction in composite second order distortion from −48 dBc to −60 dBc was obtained for a fixed modulation depth of about 4.2% per channel. The CTB increased slightly from −62 dBc to −60 dBc when the predistortion circuit was used. Although the increase in third order distortion could be minimized through the use of a different FET, the increase in third order distortion is tolerable for CATV video distribution applications.

The predistortion circuit of the invention has been described in connection with linearization of a laser diode. However, the predistortion circuit shown in FIGS. 2 and 3 and described hereinabove can be utilized to reduce or eliminate second order distortion products in any nonlinear device having a transfer function of the form given in equation (1).

While there have been shown and described what are at present considered the preferred embodiments of the present invention, it will be obvious to those skilled in the art that various changes and modifications may be made therein without departing from the scope of the invention as defined by the appended claims.

What is claimed is:

1. A circuit for minimizing the second order distortion of the output of a nonlinear device having a transfer function F of the form $F = C_1 I_1 - C_2 (I_1)^2$, where $I_1$ is a current applied to an input of the nonlinear device and $C_1$ and $C_2$ are constants, said circuit comprising:

a field effect transistor having gate, drain and source electrodes;

means for biasing said field effect transistor for approximately square law operation;

means for applying an input voltage between the gate and source electrodes of said field effect transistor, said input voltage causing a drain current to flow in said drain electrode; and means coupled between the drain electrode of said field effect transistor and the input of said nonlinear device for providing an input signal to said nonlinear device wherein said input signal to said nonlinear device is selected to be proportional to the drain current of said field effect transistor so that the second order distortion in the output of the nonlinear device is minimized.

2. A circuit as defined in claim 1 wherein said means for providing an input signal to said nonlinear device comprises an amplifier means.

3. A circuit as defined in claim 1 wherein the drain current and the gate-to-source voltage of said field effect transistor are related by an exponent N in the range of about 1.2 to 2.7.

4. A circuit as defined in claim 1 further including a resistor in series with the source electrode of said field effect transistor for scaling of the second-order coefficient of said circuit.

5. A circuit as defined in claim 1 wherein the nonlinear device is a laser diode.

* * * * *